US008206994B2

(12) United States Patent
Baroud et al.

(10) Patent No.: US 8,206,994 B2
(45) Date of Patent: Jun. 26, 2012

(54) METHOD FOR TREATING DROPS IN A MICROFLUID CIRCUIT

(75) Inventors: Charles N Baroud, Paris (FR); Jean-Pierre Delville, Talence (FR)

(73) Assignees: Centre National de la Recherche Scientifique (FR); Ecole Polytechnique (FR)

( * ) Notice: Subject to any disclaimer, the term of this patent is extended or adjusted under 35 U.S.C. 154(b) by 802 days.

(21) Appl. No.: 12/227,759

(22) PCT Filed: May 16, 2007

(86) PCT No.: PCT/FR2007/000838
§ 371 (c)(1), (2), (4) Date: Nov. 26, 2008

(87) PCT Pub. No.: WO2007/138178
PCT Pub. Date: Dec. 6, 2007

(65) Prior Publication Data

US 2009/0090422 A1 Apr. 9, 2009

(30) Foreign Application Priority Data

May 30, 2006 (FR) ..................................... 06 04819

(51) Int. Cl.
*B81B 7/02* (2006.01)
*B81B 7/00* (2006.01)
*F15C 4/00* (2006.01)

(52) U.S. Cl. ........ 436/180; 436/174; 137/827; 137/825; 137/803; 137/806; 137/833

(58) Field of Classification Search .................. 436/180, 436/174; 137/828, 827, 825, 803, 806, 833
See application file for complete search history.

(56) References Cited

U.S. PATENT DOCUMENTS

2002/0181837 A1 12/2002 Wang et al. ..................... 385/16
2008/0196778 A1 8/2008 Baroud et al. ................ 137/827

FOREIGN PATENT DOCUMENTS

| | | | |
|---|---|---|---|
| EP | 1533605 | | 5/2005 |
| WO | WO 2004/016948 | * | 2/2004 |
| WO | WO2004/071638 | | 8/2004 |
| WO | WO2005/022147 | | 3/2005 |
| WO | WO 2006/018490 | * | 2/2006 |

OTHER PUBLICATIONS

M.P. MacDonald et al., "Microfluidic Sorting in an Optical Lattice," Nature Publishing Group, London, GB, vol. 426, Nov. 27, 2003; pp. 421-424; Document XP-002289740.

* cited by examiner

*Primary Examiner* — Christine T Mui
(74) *Attorney, Agent, or Firm* — Kusner & Jaffe

(57) ABSTRACT

The invention relates to a method for treating drops in a microfluid circuit, comprising at least one microchannel (12) through which the drops flow, characterized in that a laser (26) is brought to bear on the interface of said drops in the transport liquid (F3), or on the interface of drops in contact, in order to carry out a sorting of the drops, to form nanodrops from a larger drop or to fuse drops (60, 64) in contact and initiate reactions between the fluids contained in said drops.

15 Claims, 2 Drawing Sheets

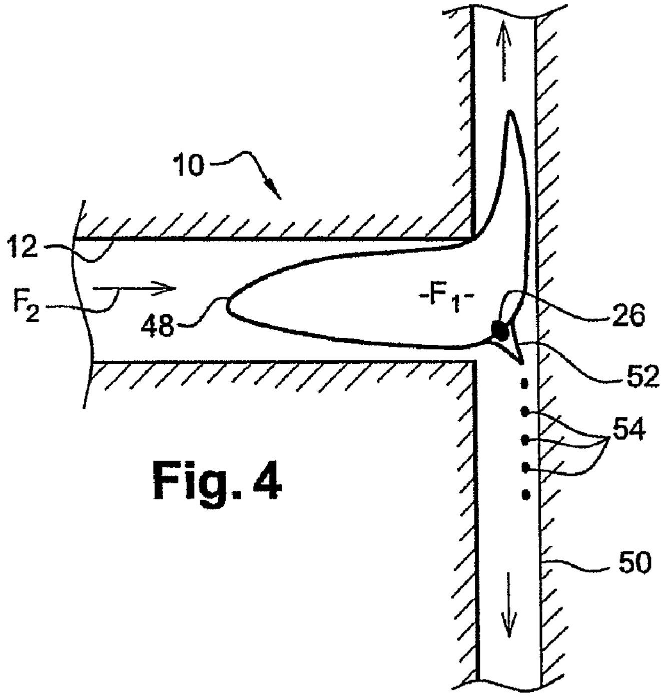
Fig. 4
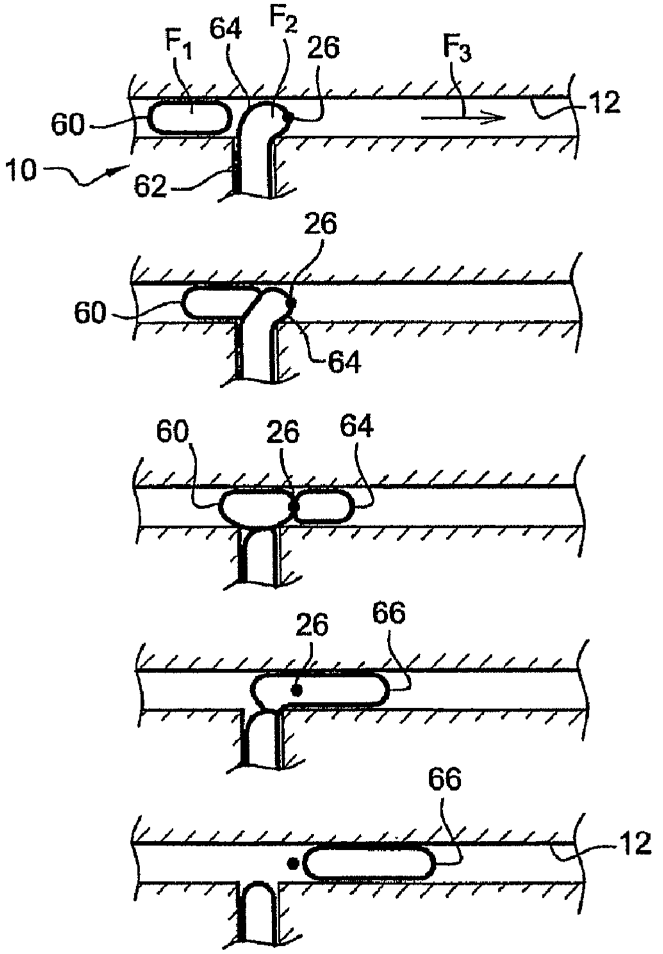
Fig. 5a
Fig. 5b
Fig. 5c
Fig. 5d
Fig. 5e

METHOD FOR TREATING DROPS IN A MICROFLUID CIRCUIT

The present invention relates to a method for treating drops in a microfluid circuit which comprises at least one microchannel containing a fluid and drops of a second fluid contained in the first fluid.

TECHNOLOGICAL BACKGROUND OF THE INVENTION

A microfluid circuit is known from the patent application FR-A-2 873 171 of the applicants, which is provided in an appropriate material such as for example PDMS (poly-dimethylsiloxane) having microchannels having typically a width of about 100 μm and a depth of 50 μm, in which very small flow rates of fluids such as air, water, oil, reagents, etc, can flow. A laser beam, the wavelength of which is not absorbed by the constitutive material of the circuit, is focused on the interface of a first fluid flowing in a microchannel and of a second fluid at least locally present in this microchannel, to force or to stop the flow of the first fluid in the microchannel, to fractionate it in drops, to mix it with the second fluid, etc., the focusing of the laser beam on the fluid interface generating a temperature gradient along this interface and causing a capillary heat convection movement of fluids.

SUMMARY OF THE INVENTION

The present invention relates to developments and particular applications of the technique described in that prior document.

The invention proposes a method for treating drops in a microfluid circuit comprising at least one microchannel containing a first fluid and drops of a second fluid contained in the first fluid, this method comprising a step of focusing a laser beam on interfaces of said drops and of the first fluid, wherein the heat sensitivity of the surface tensions of said fluids resulting from the focusing of the laser beam on the interfaces of the drops is used to sort those drops or to fractionate those drops into nanodrops or to fuse those drops when they contain different fluids, the laser beam wavelength being selected to be absorbed by the second fluid contained in the drops or by the different fluids contained in the drops, respectively, the first fluid and the constitutive material of the microchannel being transparent to this wavelength.

The invention allows, by focusing a laser beam on interfaces of fluid drops, operations to be provided in a simple and efficient manner, which were not possible in the prior technique or which necessitated the use of cumbersome and complex means:

- sorting drops of different nature, which was previously only possible with a computer loop of drop recognition and of control of electrodes implanted in the circuit,
- forming nanodrops and fusing drops containing different fluids and so forming series of microreactors when the fluids react one on the other, or one with the others, which was not possible with the means of the prior technique.

According to another feature of the invention, this method also consists, in order to sort drops of the second fluid present in the first fluid, in focusing the laser beam upstream from a Y-branch, the crest of which comprises a tip directed upstream, the focal point of the laser beam being located between the end of this tip and the wall of the microchannel opposite to the deviation direction of the drops.

The method also consists, in order to sort drops of different fluids present in the first fluid according to the heat sensitivity of the surface tension of those different fluids, in setting the power transmitted to the interfaces of the drops by the laser beam to deviate those drops or not.

For example, a laser beam can be used, the power of which is sufficient to produce a surface tension gradient on a water-air interface, which will deviate air bubbles contained in a water flow, the power of the laser beam being however too low to produce a sufficient surface tension gradient on a liquid-liquid interface.

By adding a surface-active product appropriate to a liquid, it is also possible to modify the surface tension of the liquid in order to bring the laser beam to bear on the liquid-liquid drop interfaces, e.g. to deviate liquid drops without deviating gas bubbles.

In an alternative of the invention, this method also consists in depositing a spot of a material absorbing the laser beam on the surface of the microchannel, and in directing the laser beam on this spot when the drops to be sorted flow.

In that instance, the sorting is active and necessitates an appropriate control of the laser beam.

According to another feature of the invention, to fractionate one drop into nanodrops, the method consists in immobilizing the drop by focusing the laser beam on its downstream interface in a flow of the first fluid containing a surface-active product, and in separating nanodrops of the aforesaid drop by means of this fluid flow.

One notices indeed that a very thin tip, which is directed downstream and nanodrops of which can be ejected when there is a sufficient speed gradient of the flow of the first fluid on this tip, is formed on the drop immobilized by the laser beam. The nanodrops so produced are carried along by the first fluid and can then be directed in another microchannel for posterior analyses or uses. The great size difference between the nanodrops and the other drops can be used to separate the nanodrops outside of the microchannel by sedimentation, e.g. in a centrifugal.

Practically, the drop to be fractionated can be transported in the first microchannel by the flow of the fluid containing the surface-active product and the focal point of the laser beam is then located immediately next to the branch of this microchannel and of another microchannel in which the nanodrops are deviated.

In an alternative, the drop to be fractionated can be formed and immobilized at the junction of a microchannel containing the second fluid and of at least a microchannel in which the fluid containing the surface-active product flows.

According to another feature of the invention, to fuse two drops containing different fluids, this method consists in bringing the drops in contact one with the other in a flow of the first fluid, and then in focusing the laser beam on the interface of the two drops. The different fluids can be different solutions, made up of different solutes contained in a same solvent.

For example, the transport of a first drop in the aforesaid microchannel can be blocked by focusing the laser beam on the downstream interface of this drop and of the first fluid until the arrival of a second drop containing a fluid different of that of the first drop, and then focusing the laser beam on the interface of the two drops to fuse them.

The fluids contained in those drops are miscible and focusing the laser beam on the interfaces of the drops provides the mix of those fluids.

According to a particularly interesting aspect of the invention, the fluids contained in the drops react one with the other, the fused drops forming microreactors.

One can vary the size of the drops to be fused in order to vary the quantities of reagents mixed when the drops are fused.

Further, at least one of the drops to be fused can contain at least two different fluids which are mixed one with the other when the laser beam is focused on an interface of this drop.

The reaction of the fluids contained in the fused drops can be initiated by the laser beam focused on the interfaces of the drops.

The reactions in process in the fused drops can be monitored by examining with a microscope, in a continuous or discontinuous manner, at least a part of the path followed by the drops in the microfluid circuit.

DESCRIPTION OF THE DRAWINGS

The invention will be more fully understood and other features, details and advantages thereof will more clearly appear when reading the following description, given by way of example with reference to the accompanying drawings, in which:

FIGS. 2, 3 and 4 schematically show the generation of nanodrops in a microfluid circuit according to the invention;

FIG. 5 schematically shows different phases of the drop fusion in a microfluid circuit according to the invention.

MORE DETAILED DESCRIPTION

As mentioned in the prior patent application FR-A-2 873 171 of the applicants, the microfluid circuit used in the invention is for example made up of a plate 10 of an appropriate material, such as a polymeric of the poly-dimethylsiloxane (PDMS) type by using the current technique of flexible lithography.

The microchannels 12 can be formed at the surface of the plate 10, on which a glass slide of a microscope is glued. Typically, the microchannels 12 have a width of about 100 μm and a depth of 50 μm. Nevertheless, those dimensions can be very greatly variable between a nanometric scale and a millimetric scale.

Figure 1:
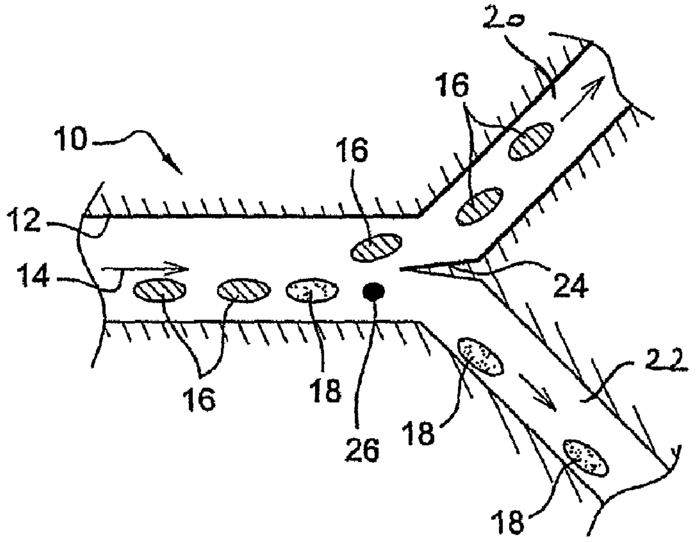
FIG. 1 schematically shows the sorting of drops in a microfluid circuit according to the invention.

In FIG. 1, the illustrated portion of the microfluid circuit comprises a microchannel 12 through which a flow 14 of a fluid, such as water, oil, reactive liquid, etc., containing drops or bubbles 16 of a second fluid and drops or bubbles 18 of a third fluid which have been illustrated in a different manner, ones with hatching and the others with doted lines, in order to be more easily differentiated ones from the others, flows.

To sort the drops 16 and 18 in the flow 14, the microchannel 12 is divided downstream into two microchannels 20, 22, forming a Y-branch, the crest of which can have a tip 24 directed upstream, which substantially extends at the middle of the microchannel 12 in the direction opposite to the flow 14. This tip 24 is not critical but makes the deviation of the drops easier.

The sorting is provided by focusing an appropriate laser beam 26 on the interface of a drop 16 or 18 and of the fluid forming the flow 14, this laser beam being for example produced by a continuous or pulsed ionized-argon generator having a repetition frequency greater than about 1 kHz, for example with a wavelength of 514 nm and a power included between 10 and 50 mW. One can as well use a laser diode or a YAG type laser, for example.

The spot of the laser beam 26, which corresponds to the impact of this beam on the interface of a drop 16 or 18, has a diameter in the order of 5 to 15 μm, for example.

The wavelength of the laser beam is selected to be not absorbed by the constitutive material of the microfluid circuit, by the fluid forming the flow 14 and by the fluid constituting the drops or the bubbles 18. This wavelength is however absorbed by the fluid forming the bubbles or drops 16.

The laser beam is focused into a point which is located upstream from the end of the tip 24 separating the microchannels 20 and 22, on the side of the microchannel 12 which is opposite to the direction of the microchannel 20 in which one wants deviate the bubbles or drops 16.

The focusing of the laser beam 26 into this point on the interface of a drop or bubble 16 and of the fluid forming the flow 14 produces a temperature gradient along this interface, which causes a capillary heat convection movement of the fluid forming the bubble or drop 16 and deviates the bubble or drop 16 to the microchannel 20, this deviation being facilitated by the tip 24.

The bubbles or drops 18 of the other fluid are transparent to the laser beam and are not deviated. As a consequence, they are transported by the flow 14 in the microchannel 22.

Using a laser beam having a wavelength of about 514 nm allows, for example, the drops containing fluorescein which absorbs this wavelength and pure water drops, which are transparent to this wavelength, to be sorted. The laser beam focused on the path of those drops allows ones containing fluorescein to be deviated and to send them in a microchannel other than the one they should normally have followed.

By using a laser having a wavelength in the order of 1480 nm, water drops can be deviated and oil drops are allowed to flow.

Air bubbles can also be sorted to remove them from a flow by using a laser beam, the wavelength of which is absorbed by the nitrogen, for example.

Alternatively, a spot of material absorbing the wavelength of the laser beam can be deposited on the surface of the microchannel 12 to locally heat the fluid which flows in this microchannel, even though this fluid does not absorb the wavelength of the laser beam. Some drops or bubbles can then be deviated by directing the laser beam on the absorbing material spot when the bubbles or drops arrive at this spot. Therefore the laser generator can also be switched ON and OFF at the intended times.

To sort fluids according to the heat sensitivity of their surface tension, the power of the laser beam used is set to produce a surface tension gradient on an interface between two fluids, which is sufficient to deviate one bubble or one drop containing one of those two fluids, and which would be too low to produce a deviation of an interface between two other fluids. For example, air bubbles contained in a liquid flow can then be deviated by using a laser beam, the power of which is sufficient to produce a surface tension gradient of the intended level on a liquid-air interface and which does not have a deviating effect on a liquid-liquid interface.

Appropriate surface-active products which will allow them to act with the laser beam on liquid-liquid interfaces to deviate liquid drops without deviating gas bubbles can also be added to liquids.

Figure 2:
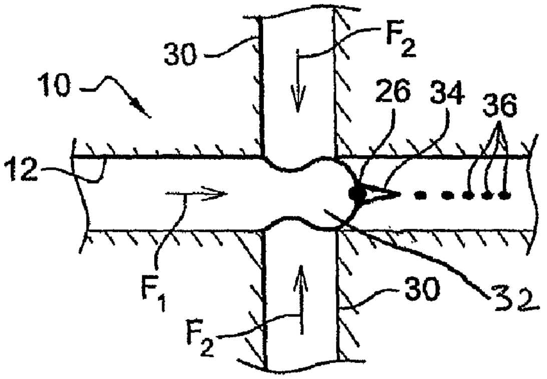

FIG. 2 illustrates a generation mode of nanodrops from a flow of a fluid F1 in a microchannel 12 of the circuit 10 by means of a flow of another fluid F2 in two microchannels 30 which are aligned with and perpendicular to the microchannel 12 on each side thereof. The fluid F2 contains a surface-active product and is not miscible with the fluid F1.

A laser beam 26, the wavelength of which is not absorbed by the microfluid circuit and by the fluid F2 and is absorbed by the fluid F1, is focused into a central point of the microchannel 12 located immediately downstream from the crossing with the microchannels 30 to block the flow of the fluid F1 in the microchannel 12 downstream from the aforesaid crossing.

The fluid F1 generates a drop 32 substantially at the intersection of the microchannels 12 and 30, this drop being retained by the laser beam 26 focused at the downstream interface between this drop and the fluid F2. The flow of the fluid F2 on this drop produces a very thin tip 34, very little drops 36 of which are separated by the carrying along effect of the fluid F2, those little drops 36 having a size typically equal to the size of the tip 34, i.e. dimensions markedly less than that of the drop 32. Typically, those little drops 36 can have a size of a hundred times less than that of the drop 32 and are called nanodrops.

In an example of embodiment, the fluid F1 is water, the fluid F2 is oil containing a small quantity (2% by weight) of a surface-active such as the one known under the denomination SPAN 80, the laser beam 26 used to block the drop 32 has a power in the order of 20 to 50 mW, the water flow rate in the microchannel 12 is in the order of 0.2 microliter/minute and the oil and surface-active flow rate in the microchannels 30 is in the order of 0.9 microliter/minute. The produced nanodrops 36 have a size in the order of 1,000 nm.

Figure 3:
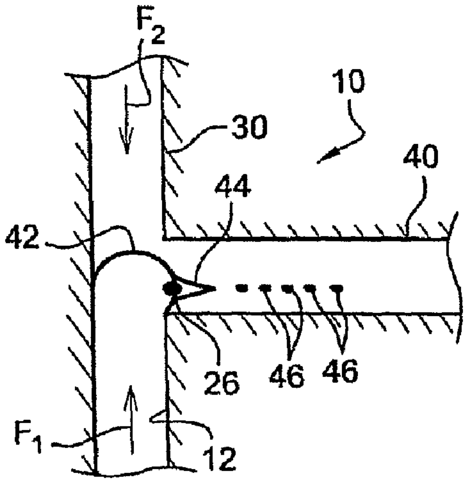

In the alternate embodiment of FIG. 3, the fluid F1 and the fluid F2 flow in directions opposite one to the other in two aligned microchannels 12, 30 which communicate, at their junction, with a third perpendicular microchannel 40. The laser beam 26 is focused on the interface of a drop 42 of the fluid F1 which is generated at the outlet end of the microchannel 12 and which is retained by the laser beam.

As previously, a very thin tip 44 directed downstream in the microchannel 40 and nanodrops 46 of which are separated by the fluid flow F2 containing the surface-active product is generated on the interface of the drop 42.

In the alternative of FIG. 4, a drop 48 of the fluid F1 is contained in a flow of the fluid F2 flowing in a microchannel 12 which separates itself downstream into two microchannels 50 perpendicular to the microchannel 12 and opposite one to the other. The drop 48 of fluid F1 is deviated in one of the microchannels 50 by focusing the laser beam 26 at a point of its interface with the fluid F2, on the side located toward the other microchannel 50. A very thin tip 52 oriented downstream from this other microchannel 50, and nanodrops 54 of which are separated by the flow of the fluid F2, is generated at the impact point of the laser beam 26.

Nanodrops 36, 46 and 54 which are coated with the surface-active product and which are for example intended to be analyzed can then be generated, when it is a matter of samples made on a drop of the fluid F2, or which are intended for another use, e.g. for chemical reactions.

Focusing a laser beam having an appropriate wavelength on the interface of two drops further allows those two drops to be fused as schematically illustrated in FIG. 5.

Generally, in the prior technique, it is difficult, even not possible, to fuse drops containing different fluids and which are transported by a third fluid, because not only the streams of the three fluids interact in a dynamic manner, but the third fluid further generates a separation film between the drops containing the first and second fluids.

According to the invention, focusing a laser beam on the interface between two drops allows a generation of a flow which the third fluid film separating the two drops and which then allows them to be fused.

In the exemplary embodiment of FIG. 5, a first fluid F1 is contained in a drop 60 transported by a flow of fluid F3 in a microchannel 12, in which a microchannel 62 is opened out and also flowed by a flow of the fluid F3 and containing drops

64 of another fluid F2 (alternately, a flow of the fluid F2 is also able to flow through the microchannel 62), the fluids F1 and F2 being miscible.

In FIG. 5*a*, focusing a laser beam 26 on the interface of a drop 64 of the fluid F2 exiting from the microchannel 62, lightly downstream from the outlet end of this microchannel in the first microchannel 12, allows the drop 64 to be blocked until the arrival of a drop 60 of the fluid F1.

When this drop 60 strikes the portion of the drop 64 of fluid F2 which is located in the microchannel 12, as shown in the FIG. 5*b*, the two drops 60 and 64 begin to progress together in the microchannel 12 until their contact interface passes through the laser beam 26, as shown in FIG. 5*c*.

At this time, the flow inducted by heating the interface with the laser beam causes the fusing of two drops into a single drop 66, as illustrated in FIG. 5*d*, and the mixing of the fluids F1 and F2 within this single drop.

Then, as illustrated in FIG. 5*e*, the single drop 66 is carried along by the flow of the fluid F3 in the microchannel 12.

This single drop 66 generates a microreactor when the mixed fluids F1 and F2 react one with the other.

The reaction can be monitored by examining the drop 66 with a microscope, along its path in the microchannel 12. Eventually, this path can be determined so that the drop 66 stays in the viewing field of the microscope or passes again, at regular intervals, in this viewing field.

It is understood that one can vary the sizes of the drops 60 and 64 containing the fluids F1 and F2 as desired and then vary the quantities of those fluids which react one with the other in the single drop 66 as desired. It allows a very rapid series carrying out of reactions with variable concentrations of reactive products.

The action of the laser beam 26 within the drop 66 also allows the reaction between the fluids F1 and F2 to be thermally initiated. This action also causes the generation of a mix of those fluids within the single drop 66.

One can also provide that one of the drops 60 and 64 not only contains one fluid but two different fluids which can be mixed by the laser beam 26 brought to bear on the drop which contains them.

The drops 66 which generate microreactors have typically volumes in the order of one nanoliter or even of a picoliter.

Generally, one can see that the laser beam acting on the interface of a fluid drop or bubble can be used as a smart actuator providing a substantially great number of functions such as blocking the drop, deviating the drop, creating nanodrops, fusing the drop with another drop, mixing the fluid or the fluids contained in the drop, and triggering off a chemical reaction in the drop.

What is claimed is:

1. A method for treating drops in a microfluid circuit comprising at least one microchannel containing a first fluid and drops of at least a second fluid contained in the first fluid by focusing a laser beam on interfaces of said drops and of the first fluid, wherein said method comprises modifying the surface tensions of said fluids by adding appropriate surface-active products to those fluids, and in using the heat sensitivity of the surface tensions of said fluids resulting from the focusing of the laser beam on the interfaces to sort those drops or to fractionate them into nanodrops or to fuse them when they contain different fluids, the laser beam wavelength being selected to be absorbed by the second fluid contained in the drops or by the different fluids contained in the drops, respectively, the first fluid and the constitutive material of the microchannel being transparent to this wavelength, wherein in order to sort drops of the second fluid present in the first fluid, the laser beam is focused upstream from a Y-branch, the crest of which comprises a tip directed upstream, the focal point of the laser beam being located between the end of this tip and the wall of the microchannel opposite to the deviation direction of the drops.

2. A method according to claim 1, wherein drops of different fluids present in the first fluid are sorted by setting the power transmitted to the interfaces of the drops by the laser beam.

3. A method according to claim 1, wherein the surface tensions of said fluids are modified by adding appropriate surface-active products to those fluids.

4. A method according to claim 1, further comprising the steps of depositing a spot of a material absorbing the laser beam on the surface of the microchannel and directing the laser beam on this point when the drops to be sorted flow through the microchannel.

5. A method for treating drops in a microfluid circuit comprising at least one microchannel containing a first fluid and drops of at least a second fluid contained in the first fluid by focusing a laser beam on interfaces of said drops and of the first fluid, wherein said method comprises modifying the surface tensions of said fluids by adding appropriate surface-active products to those fluids, and in using the heat sensitivity of the surface tensions of said fluids resulting from the focusing of the laser beam on the interfaces to sort those drops or to fractionate them into nanodrops or to fuse them when they contain different fluids, the laser beam wavelength being selected to be absorbed by the second fluid contained in the drops or by the different fluids contained in the drops, respectively, the first fluid and the constitutive material of the microchannel being transparent to this wavelength, wherein, to fractionate one drop into nanodrops, said drop is immobilized by focusing the laser beam on its downstream interface in a flow of another fluid containing a surface-active product, and in separating nanodrops of the aforesaid drop by means of this fluid flow.

6. A method according to claim 5, wherein the drop to be fractionated is transported in a microchannel by the flow of the fluid containing the surface-active product and the focal point of the laser beam is located immediately next to the junction of this microchannel and of another microchannel in which the nanodrops are deviated.

7. A method according to claim 5 or 6, wherein the drop to be fractionated is formed and immobilized at the junction of a microchannel containing the fluid generating this drop and of at least a microchannel in which the fluid containing the surface-active product flows.

8. A method for treating drops in a microfluid circuit comprising at least one microchannel containing a first fluid and drops of at least a second fluid contained in the first fluid by focusing a laser beam on interfaces of said drops and of the first fluid, wherein said method comprises modifying the surface tensions of said fluids by adding appropriate surface-active products to those fluids, and in using the heat sensitivity of the surface tensions of said fluids resulting from the focusing of the laser beam on the interfaces to sort those drops or to fractionate them into nanodrops or to fuse them when they contain different fluids, the laser beam wavelength being selected to be absorbed by the second fluid contained in the drops or by the different fluids contained in the drops, respectively, the first fluid and the constitutive material of the microchannel being transparent to this wavelength, wherein, to fuse two drops containing different fluids, the drops are brought in contact one with the other in a flow of another fluid, and then a laser beam is focused on the interface of the drops.

9. A method according to claim 8, wherein the transport of a drop in the microchannel is blocked by focusing the laser beam on the downstream interface of this drop and of the transport fluid until the arrival of another drop containing a fluid different of that of the first drop, and then in focusing the laser beam on the interface of the two drops.

10. A method according to claim 8 or 9, wherein the fluids contained in the drops are miscible.

11. A method according to claim 8, wherein the fluids contained in the drops react one with the other and in that the fused drops form microreactors.

12. A method according to claim 11, wherein the size of the drops to be fused are varied, in order to vary the quantities of the reagents mixed when the drops are fused.

13. A method according to claim 8, wherein at least one of the drops to be fused contains at least two different fluids, which are mixed one with the other when the laser beam is focused on the drop.

14. A method according to claim 11, wherein the reaction of the fluids contained in two fused drops is initiated by the laser beam focused on those drops.

15. A method according to claim 11, wherein the reaction of the fluids in the fused drops is monitored by examining those drops with a microscope, in a continuous or discontinuous manner, on at least a part of the path followed by those drops in the microfluid circuit.

* * * * *